United States Patent [19]

Oishi et al.

[11] 4,344,101
[45] Aug. 10, 1982

[54] TESTERS

[75] Inventors: Yasuo Oishi; Imao Ushimaru, both of Uedashi, Japan

[73] Assignee: Kaise Electric Works Ltd., Uedashi, Japan

[21] Appl. No.: 165,665

[22] Filed: Jul. 3, 1980

[30] Foreign Application Priority Data

Sep. 18, 1979 [JP] Japan .................................. 54-119643

[51] Int. Cl.³ .............................................. H02H 3/06
[52] U.S. Cl. ........................................ 361/75; 361/71; 361/88; 361/91; 324/110
[58] Field of Search ...................... 361/71, 74, 75, 93, 361/94, 98, 101, 88, 89, 91; 324/110, 115, 119

[56] References Cited

U.S. PATENT DOCUMENTS

| | | | |
|---|---|---|---|
| 2,451,953 | 10/1948 | Ingram | 324/110 |
| 3,024,388 | 3/1962 | Blitchington | 324/110 X |
| 3,042,865 | 7/1962 | Stetzler | 324/110 |
| 3,426,274 | 2/1969 | Wise | 324/110 |
| 3,666,993 | 5/1972 | Legatti | 324/110 X |
| 4,092,591 | 5/1978 | Lozowski | 324/110 |

FOREIGN PATENT DOCUMENTS 673931  7/1979  U.S.S.R. .............................. 324/110

Primary Examiner—Patrick R. Salce
Attorney, Agent, or Firm—Birch, Stewart, Kolasch & Birch

[57] ABSTRACT

A circuit tester is disclosed which automatically open-circuits a main lead to an input circuit in response to an excessive overcurrent. The circuit tester of the present invention will automatically sense the existence of an excessive current which, in turn, open-circuits a main lead to the input circuit, actuates a buzzer and energizes a light-emitting diode. Since the main-lead to the input circuit has been open-circuited, the base voltage at a first transistor drops. This renders this transistor non-conductive and tends to cause the main-lead to the input circuit to short-circuit. This tends to restore the circuit tester to its initial condition. However, if the excessive current is continuing, the above sequence will re-commence, the sequence continuing until the excessive current no longer exists or until the tester is adjusted to a higher range of operation.

9 Claims, 1 Drawing Figure

TESTERS

BACKGROUND OF THE INVENTION

1. Field of the Invention

The present invention relates to testers, especially those testers which include at least two input terminals, a galvanometer capable of visual indication of measured values, and a network which is located between the input terminals and the galvanometer and capable of converting signals generated at the input terminals to the level suitable for the operation of the galvanometer.

2. Description of the Prior Art

The circuit tester is in wide use for a variety of measurements on electric circuits, e.g., for voltage measurements in a wide range from several hundred mV to ca. 1000 V. Given such uses, it is inevitable that a tester, set for a lower voltage range, may be used, by mistake, to measure voltages higher than the maximum voltage setting on the tester. Such mistaken operations often result in damage to meters, circuit elements (such as resistors), or patterns, within the tester.

As a protective means for circuits to guard against such mistaken operations, some conventional testers have fuses equipped in their input circuits. The use of fuses, however, results in disadvantages in that measurements of electric currents result in errors since the fuse possesses a finite resistance and the measurement accuracy is lowered since the fuse resistance is temperature dependent. When an excess current is caused to flow, it takes the fuse some period of time to burn out, sometimes resulting in damage to the internal circuits. The fuse needs to be replaced after burn-out. Thus, the use of a fuse has specific disadvantages from the standpoint of maintenance of the tester.

Some testers have been designed to allow their relays to detect overcurrent and to cut off their input circuits for measurement. Japan Pat. No. 53-38481/1978 describes an example tester of this sort which uses a latching relay. This latching relay has a temporary stable state and a semipermanent stable state, the transition from the former to the latter state being effected by a flow of current over the working range through the coil, the reverse transition by external mechanical force being exerted via manual operation, etc. In general, relays are suitable for protecting tester circuits since they have low contact resistance with low temperature dependence and are capable of rapid reaction. In addition, the use of relays permits the protective operation to be executed at the same multiplying factor among all the measurement ranges, so that they may protect not only the current measuring circuits but also the voltage measuring circuits as well. The tester using the latching relay may cut off its input circuit in response to an excessive current by shifting into the semipermanent state. However, this tester has operational disadvantages in that manual operation is required to reset the relay from the semipermanent to the temporary stable state, and in that, before the cause for the input of the excessive current is removed, the tester may reset its relay resulting in a closed input circuit having the same excessive input current to its measuring circuit. It has an additional structural disadvantage in that, since the temporary stable state is a so-called "unstable stable-state", where the relay has its set of springs under some tension, the tester, when in the temporary stable state, may have its input circuit cut off in response to an accidental external force such as vibration, shock, etc. Such a structure makes the relay so large that it is difficult to build such a relay in a small-sized tester.

SUMMARY OF THE INVENTION

One of the objects of the present invention is to eliminate the above-described disadvantages of the conventional techniques in order to provide testers having devices which are capable of rapidly and completely protecting its measuring circuits without exerting any reducing effects on its measurement accuracy.

Another object of the present invention is to provide testers with improved manageability in that the restoring operation does not require any manual operation.

Still another object of the present invention is to provide testers which are small in size, have high reliability, and are free of faulty operation due to accidental exertion of external forces.

The above objects of the present invention have been fulfilled through construction of testers which have the first and second stable states and which are provided with two devices: an overcurrent detecting device which allows the transition from the first to the second stable state when the galvanometer detects a current which exceeds the specified value; a circuit cut-off device which, in response to transition from the first to the second stable state, cuts off the line between the input terminal and the network for the measuring unit.

In one embodiment of the present invention, an example tester is provided wherein the transition to the second stable state is allowed by initiation of a time-limiting operation, which causes the overcurrent detecting device, after a lapse of a prescribed time, to shift into the first stable state, thereby closing the line between the input terminal and the network of the measuring unit.

In another example tester of the present invention, the transition to the second stable state is followed by the actuation of an alarm on the outside of the tester.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
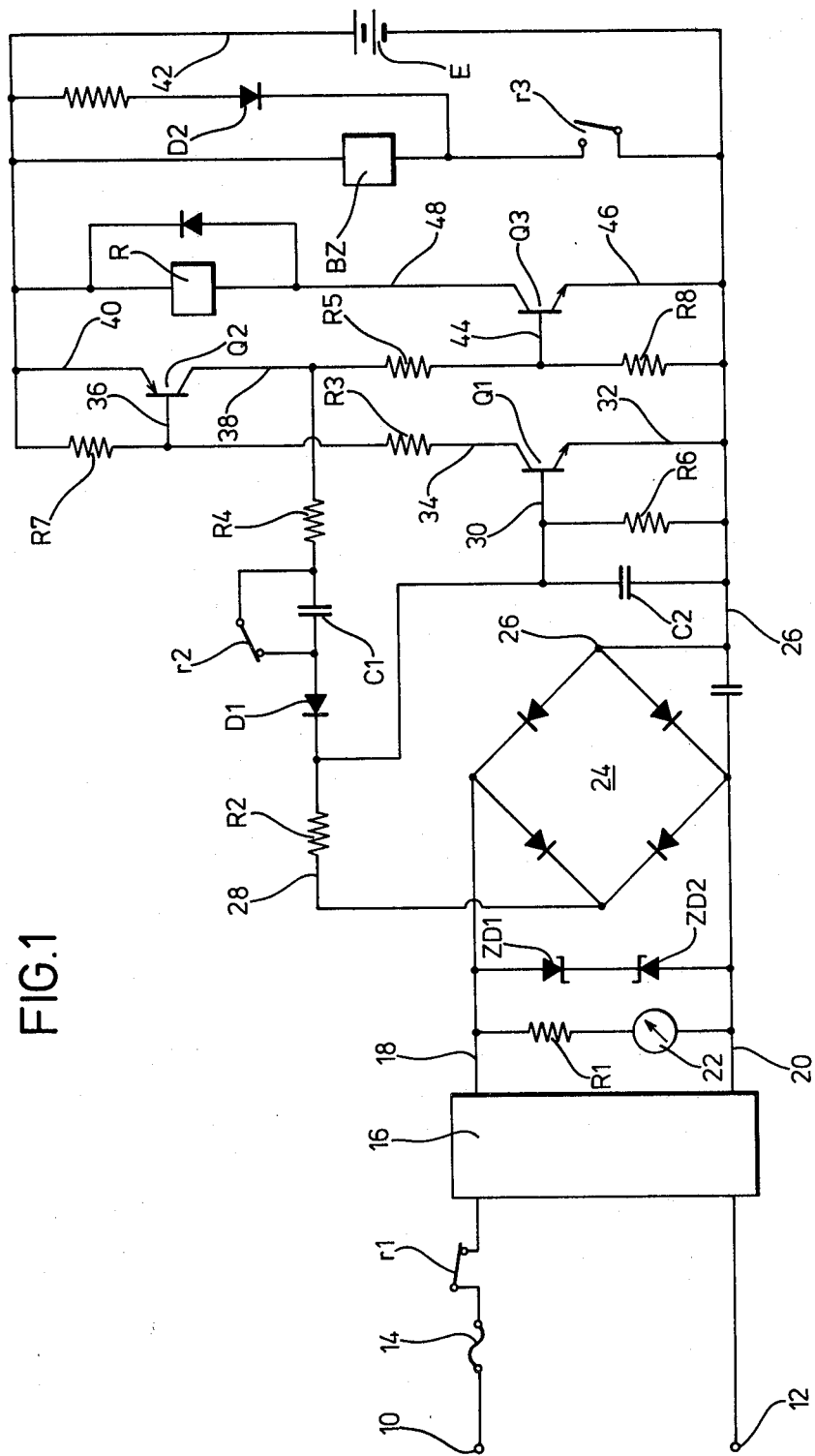
FIG. 1 is a circuit diagram of a tester of the present invention.

Referring to FIG. 1, an example tester of the present invention is illustrated. The tester comprises a pair of input terminals 10 and 12 for receiving inputs to be measured, a measuring-device network 16 connected with the pair of input terminals via a fuse 14 and a break contact point r1, and a galvanometer 22 connected via the resistor R1 with the output terminals 18 and 20 which are also the leads of the network 16. The galvanometer 22 may be a common instrument, e.g., a meter, which gives a visual indication of value of voltage, current, or resistance corresponding to the flow of current therethrough. The measuring-device network 16, one of the major components of the tester, may be a common circuit which is capable of converting various forms of input signals generated at the input terminals 10 and 12 into those signals which are suitable in form and level for the action of the galvanometer 22. The fuse 14 is provided as a redundant component to cut off overcurrent and may be omitted. The circuit of FIG. 1 employs the separate representation method to denote coils and contacts of relays, in such a way that the relay coil is denoted with the upper case letters of the alphabet and the contact driven by that coil is denoted by the corresponding lower case letter and that, if one coil operates more than one contact, serial numbers are attached. For example, the contact r1 is the first contact which is put into operation when the relay coil R is energized.

A pair of zener diodes ZD1 and ZD2 in opposed-parallel connection and the diode rectifying circuit 24 are connected with the leads 18 and 20. The terminal 26, one of the output terminals of the circuit 24, is connected with the negative common splice 26' of the dc power source E and the other output terminal 28 is connected with the base electrode 30 of the NPN transistor Q1 via the resistor R2. The emitter electrode 32 of the transistor Q1 is connected with the common splice 26' and the collector electrode 34 is connected with the base electrode 36 of the PNP transistor Q2 via the resistor R3. The emitter electrode 40 of the transistor Q2 is connected with the positive pole of the power source E. The resistor R2 is connected via the diode D1 to the parallel combination of the condenser C1 and the break contact r2 and is further connected via the resistor R4 to the collector electrode 38 of the transistor Q2. This collector electrode 38 is also connected via the resistor R5 to the base electrode 44 of the NPN transistor Q3. The emitter electrode 46 of the transistor Q3 is connected to the common splice 26' and the collector electrode 48 is connected to the coil of the relay R. The resistor R6, R7, and R8 are the bias resistors of the transistors Q1, Q2, and Q3, respectively. When both the poles of the power source E are connected, via the make-contact r3 of the relay R, the buzzer BZ and the light-emitting diode D2 are actuated.

The sequence of the operation of this tester is as follows. A current flowing through the galvanometer 22 and resistor R1 gives a voltage in relation to the sum of the resistances of resistor R1 and the internal resistance of the galvanometer.

If this voltage exceeds the zener voltage of the zener diode ZD1 or ZD2, it is clamped. When a mistaken operation has given the leads 18 and 20 a voltage having a reverse polarity, the rectifying circuit 24 prevents any unfavorable effects from propagating beyond the circuit 24 to the right section.

When an overcurrent happens to flow through the galvanometer 22, causing the rectifying circuit via the resistor R2 to pass a current over the prescribed threshold value, the transistor Q1 will pass the current. This passage of current lowers the voltages of the collector electrode 34 of the transistor Q1 and the base electrode 36 of the transistor Q2, causing the transistor Q2 to pass current, which in turn raises the voltages of the collector electrode 38 of the transistor Q2 and the base electrode 44 of the transistor Q3, causing the transistor Q3 to pass current. Thus, the relay R is energized.

The excitation of the relay R causes the break contact r1 to be put into operation with a successive cut-off of the input circuit of the tester. Thus, the overcurrent is prevented from entering the measuring-device network 16 and the galvanometer 22. Simultaneously, the second break contact r2 is caused to open, allowing the condenser C1 to be gradually charged by the use of the path connecting the positive pole 42 of the power source E, the emitter-collector route of the transistor Q2 in operation, the resistor R4, the diode D1, and the resistor R6. Until the condenser C1 has been completely charged, both the positive voltage supplied from the source E via this charging path and the voltage accumulated at the condenser C2 serve to keep the transistor Q1 conductive, successively permitting the transistor Q2 to be kept conductive. However, when the contact r1 is put into operation resulting in the cut-off of the input into the lead 18 and the complete charging of the condenser C1, this lowers the base voltage of the transistor Q1, the transistor Q1 is put into a cut-off (non-conductive) state and, simultaneously, the transistor Q2 is made non-conductive. This sequence successively causes the transistor Q3 to become non-conductive, resulting in the restoration of the relay R.

The restoration of the relay R is accompanied by the closing of the break contact r2 resulting in the conduction of current therethrough, which is followed by an instantaneous discharge of the accumulated charges of the condenser C1.

When the condenser C1 has completed its discharge, the relay R is restored and the apparatus is returned to its initial state. No problems are left if, by this time, the cause for making the current excessive has been removed, for example, by selecting a higher measurement range; otherwise, the apparatus will repeat the same troubled operation.

The example tester shown in the drawing is equipped with a circuit capable of attracting a user's attention to the detected overcurrent state. This circuit comprises the buzzer BZ issuing an audible alarm and a light-emitting element for providing a visual display, such as the light-emitting diode D2 or a lamp. These are all driven in connection with the make contact r3 of the relay R.

Having the above-described structure, the tester from the present invention may respond rapidly to the flow of overcurrent with the effective protection afforded to the measurement circuit of the present invention; no overcurrent will be imposed continuously for a long period of time on the measurement circuit. The apparatus is manageable since it requires no manual reset operation. In addition, it requires no special mechanical parts such as a latching relay, and may be packaged on a printed-circuit board since it uses electronic circuits composed of common separate parts and/or integrated circuits. The present invention may, therefore, offer for small-sized high-reliability testers a fault-free operation, providing adequate protection against actions caused by an accidentally applied external force.

The present invention has been described in detail by the use of an appropriate example application. The scope of application of the present invention is, however, not limited to this example application, but may of course cover a variety of modifications within the range in conformity with the spirit of the present invention.

I claim:

1. A circuit tester having input terminals for receiving an electrical signal having a parameter to be tested, comprising:

current measuring means for quantizing a current flowing therethrough;

means for converting a parameter of said electrical signal to be tested into a current for application to said current measuring means;

overcurrent detection means responsive to said current measured by said current measuring means for determining if said current flowing into said current measuring means exceeds a predetermined value and generating an output signal when said current exceeds said predetermined value; and input current cut-off means responsive to said output signal from said overcurrent detection means for open-circuiting one of said input terminals and terminating the flow of said current to said current measuring means and said overcurrent detection means, said overcurrent detection means terminating said output signal after a period of time elapses following open-circuiting of said one of said input terminals to thereby cause said input current cut-off means to close circuit said one of said input terminals to reinstate the flow of current to said current measuring means.

2. A circuit tester in accordance with claim 1 wherein said electrical signal parameter to be tested is a voltage; and wherein said means for converting limits the amplitude of said voltage received by said output terminals of said tester.

3. A circuit tester in accordance with claims 1 or 2 further comprising alarm means responsive to the generation of said output signal from said overcurrent detection means for emitting an alarm sound when said output signal is generated to audibly indicate that said current flowing into said input terminals exceeds said predetermined value.

4. A circuit tester in accordance with claims 1 or 2 further comprising:

audible alarm means and lamp means connected across said alarm means responsive to the generation of said output signal from said overcurrent detection means for emitting an alarm sound and for lighting a lamp, respectively, when said output signal is generated to indicate that said current flowing into said input terminals exceeds said predetermined value.

5. A circuit tester in accordance with claim 1 wherein said overcurrent detection means further comprises transistor means responsive to said current measured by said current measuring means for conducting and generating said output signal when said current exceeds said predetermined value;

wherein said input current cut-off means comprises relay means including coil means responsive to the output signal generated by said transistor means, and relay contact means in series with said one of said input terminals, said coil means opening said relay contact means when energized by said output signal from said transistor means.

6. A circuit tester in accordance with claim 5 wherein said input current cut-off means includes charging means connected to said transistor means at its base and responsive to the current from said power supply for storing charge when said relay means opens said relay contact means, the stored charge of said charging means changing the base voltage at said base of said transistor means and causing said transistor means to cease conduction and to thus terminate the generation of said output signal from said transistor means, said coil means closing said relay contact means in response to the termination of the generation of said output signal from said transistor means.

7. A circuit tester in accordance with claim 6 wherein said electrical signal parameter to be tested is a voltage; and wherein said means for converting limits the amplitude of said voltage received by said input terminals of said tester.

8. A circuit tester in accordance with claim 7 further comprising:

alarm means responsive to the generation of said output signal from said overcurrent detection means for emitting an alarm sound when said output signal is generated to audibly indicate that said current flowing into said input terminals exceeds said predetermined value.

9. A circuit tester in accordance with claim 7 further comprising:

audible alarm means and lamp means connected across said alarm means responsive to the generation of said output signal from said overcurrent detection means for emitting an alarm sound and for lighting a lamp, respectively, when said output signal is generated to indicate that said current flowing into said input terminals exceeds said predetermined value.

* * * * *